United States Patent
Sato et al.

(10) Patent No.: US 10,483,422 B2
(45) Date of Patent: Nov. 19, 2019

(54) PHOTOVOLTAIC DEVICE AND METHOD FOR MANUFACTURING THE SAME

(75) Inventors: Daisuke Sato, Susono (JP); Hiroyuki Yaguchi, Saitama (JP); Shuhei Yagi, Saitama (JP)

(73) Assignees: TOYOTA JIDOSHA KABUSHIKI KAISHA, Toyota-shi (JP); NATIONAL UNIVERSITY CORPORATION SAITAMA UNIVERSITY, Saitama-shi (JP)

( * ) Notice: Subject to any disclaimer, the term of this patent is extended or adjusted under 35 U.S.C. 154(b) by 642 days.

(21) Appl. No.: 14/380,612

(22) PCT Filed: May 15, 2012

(86) PCT No.: PCT/JP2012/062365
§ 371 (c)(1),
(2), (4) Date: Aug. 22, 2014

(87) PCT Pub. No.: WO2013/128661
PCT Pub. Date: Sep. 6, 2013

(65) Prior Publication Data
US 2015/0287867 A1 Oct. 8, 2015

(30) Foreign Application Priority Data
Feb. 28, 2012 (JP) .................... 2012-042322

(51) Int. Cl.
*H01L 31/0352* (2006.01)
*H01L 31/0693* (2012.01)
(Continued)

(52) U.S. Cl.
CPC .......... *H01L 31/0693* (2013.01); *B82Y 20/00* (2013.01); *H01L 31/035236* (2013.01);
(Continued)

(58) Field of Classification Search
None
See application file for complete search history.

(56) References Cited

U.S. PATENT DOCUMENTS 5,563,423 A * 10/1996 Wu ................. B82Y 20/00
257/17
5,851,310 A 12/1998 Freundlich et al.
(Continued)

FOREIGN PATENT DOCUMENTS

JP  2005-332945  12/2005
JP  2009-26887  2/2009
(Continued)

OTHER PUBLICATIONS

Science Notes "List of Electronegativity Values of the Elements" http://sciencenotes.org/list-of-electronegativity-values-of-the-elements/ accessed Jul. 25, 2016.*
(Continued)

*Primary Examiner* — Magali P Slawski
(74) *Attorney, Agent, or Firm* — Oblon, McClelland, Maier & Neustadt, L.L.P.

(57) ABSTRACT

Provided is a photovoltaic device prepared with a semiconductor including a localized level or an intermediate band in a forbidden band and capable of improving the performance than before. The photovoltaic device includes a plurality of first layers made of a first semiconducting material and a plurality of second layers made of a second semiconducting material that is different from the first semiconducting material, wherein the second semiconducting material includes a localized level or intermediate band in a forbidden band, the first layers and the second layers are alternately laminated one by one, at least two of the second layers are each disposed between a pair of the first layers, and a thickness of each of the second layers is thinner than a
(Continued)

thickness of four molecular layers of the first semiconducting material.

8 Claims, 12 Drawing Sheets

(51) Int. Cl.
*H01L 31/18* (2006.01)
*B82Y 20/00* (2011.01)
(52) U.S. Cl.
CPC ........ *H01L 31/184* (2013.01); *H01L 31/1848* (2013.01); *Y02E 10/544* (2013.01); *Y02P 70/521* (2015.11)

(56) References Cited

U.S. PATENT DOCUMENTS

| | | | |
|---|---|---|---|
| 6,147,296 A | 11/2000 | Freundlich | |
| 6,150,604 A | 11/2000 | Freundlich et al. | |
| 6,372,980 B1* | 4/2002 | Freundlich | B82Y 20/00 136/255 |
| 2009/0165839 A1 | 7/2009 | Zeman et al. | |
| 2011/0180124 A1* | 7/2011 | Goldbach | H01L 31/022466 136/244 |
| 2012/0174971 A1* | 7/2012 | Freundlich | B82Y 30/00 136/255 |
| 2013/0269760 A1* | 10/2013 | Mazzer | H01L 31/035236 136/255 |

FOREIGN PATENT DOCUMENTS

| | | |
|---|---|---|
| JP | 2009-117431 | 5/2009 |
| JP | 2011-77474 | 4/2011 |
| WO | WO 2007/063102 A1 | 6/2007 |
| WO | WO 2009/011338 A1 | 1/2009 |

OTHER PUBLICATIONS

International Search Report dated Jul. 10, 2012, in PCT/JP12/062365 filed May 15, 2012.
Buyanova, et al., "Mechanism for low-temperature photoluminescence in GaNAs/GaAs structures grown by molecular-beam epitaxy", Applied Physics Letters, vol. 75, No. 4, Jul. 26, 1999, 2 pages.
Written Opinion of the International Searching Authority dated Jul. 10, 2012, in International Application No. PCT/JP2012/062365 (with English translation).
Japanese Petition issued Aug. 11, 2014, in International Application No. PCT/JP2012/062365 (with English translation).
C.H. Gao and W.J. Fan, "Design of InGaAs/GaAs Quantum Well Laser Emitting At 980nm", School of Electrical & Electronic Engineering, Nanyang Technological University, pp. 1-4.

* cited by examiner

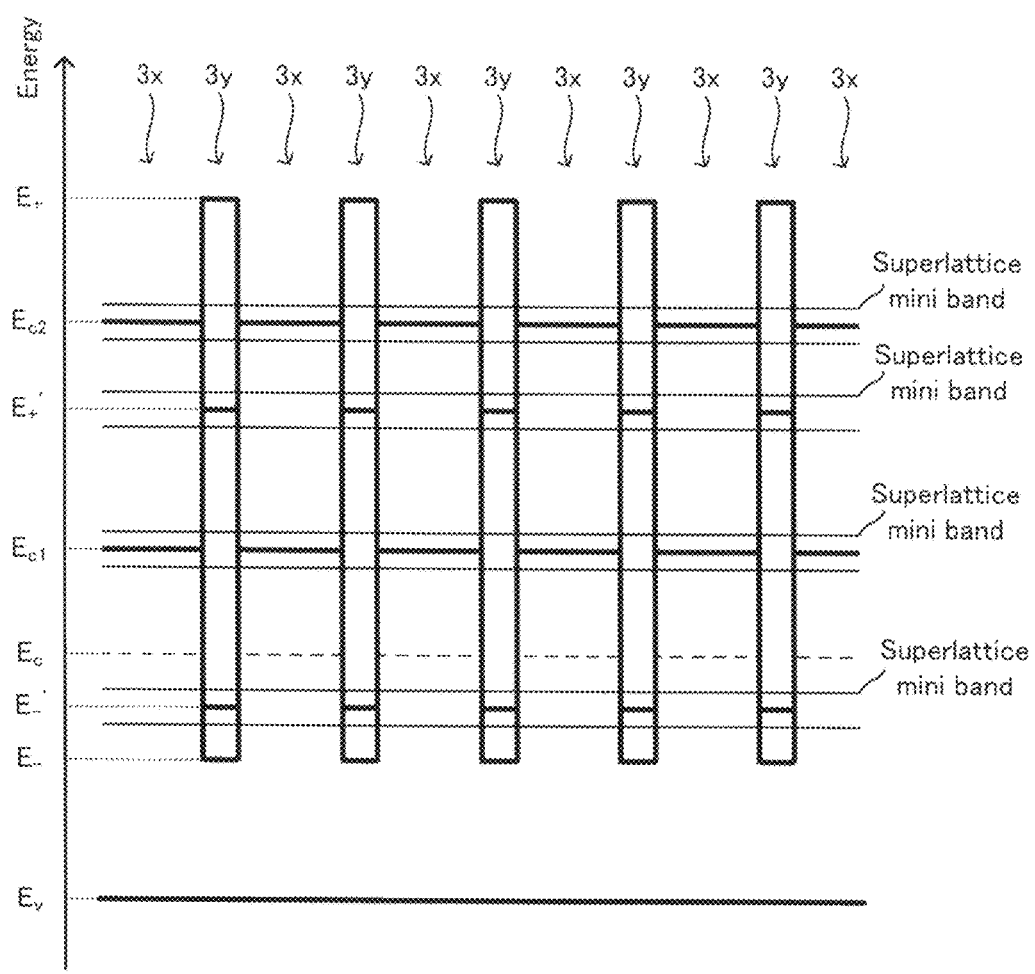

PRIOR ART

PHOTOVOLTAIC DEVICE AND METHOD FOR MANUFACTURING THE SAME

TECHNICAL FIELD

The present invention relates to a device utilizing photovoltaic effect and a method for manufacturing the device.

BACKGROUND ART

It is hoped that a solar cell contributes to prevention of global warming since the amount of carbon dioxide emission per power generation is small and it does not need any fuel for power generation. Currently, among solar cells in practical use, a mono-junction solar cell prepared with a single-crystal silicon or a polycrystal silicon and having a pair of p-n junction has become mainstream, and researches and developments regarding solar cells having various kinds of configurations have been proceeded in order to achieve a high performance of the solar cells.

As a material of a solar cell, a semiconductor including a localized level or an intermediate band in a forbidden band has been proposed until now. By employing such a semiconductor, in addition to making a configuration in which electrons are excited from a valence band to a conduction band, it is possible to excite electrons from the valence band to the localized level or the intermediate band, and from the localized level or the intermediate band to the conduction band. That is, since it becomes possible to absorb light having a lower energy than an energy corresponding to the width of the forbidden band, it is considered that it is possible to achieve a high performance of a solar cell by using a semiconductor including a localized level or an intermediate band in the forbidden band.

As a related art of the solar cell described above, Patent Document 1 for example discloses a p-n junction solar cell including an n-type semiconductor laminated to a light-entering side of a p-type light absorbing layer, the n-type semiconductor having a wider forbidden band than that of the p-type light absorbing layer, wherein the p-type light absorbing layer has a localized level or an intermediate band in its forbidden band. Patent Document 1 discloses an example in which the p-type light absorbing layer is defined as $ZnTe_{1-x}O_x$, and the thickness of the $ZnTe_{1-x}O_x$ is determined as 1000 nm. Also, Non-Patent Document discloses a technique for producing GaNAs by means of continuously supplying nitrogen, the GaNAs being a semiconductor including a localized level or an intermediate band in a forbidden band in the same way as in $ZnTe_{1-x}O_x$.

CITATION LIST

Patent Documents

Patent Document 1: Japanese Patent Application Laid-Open Publication No. 2009-117431

Non-Patent Documents

Non-Patent Document 1: I. A. Buyanova and 6 others, "Mechanism for Low-temperature Photo Luminescence in GaNAs/GaAs Structures Grown by Molecular-beam Epitaxy", Applied Physics Letters, 1999, Vol. 75, pp. 501-503

SUMMARY OF THE INVENTION

Problems to be Solved by the Invention

According to the technique disclosed in Patent Document 1, it is possible to obtain a solar cell prepared with a semiconductor including a localized level or an intermediate band in a forbidden band. However, if the semiconductor is thick as in the technique disclosed in Patent Document 1, it is difficult for additive elements that produce the localized level or the intermediate band in the forbidden band (hereinafter, the additive elements are sometimes simply referred to as "additive element") to be uniformly distributed in a thickness direction of the semiconductor, whereby the additive elements tend to be unevenly distributed. If the additive elements are distributed having uneven distances between adjacent atoms of the additive elements, not only is it difficult to form a clear intermediate band but also a radiation recombination and non-radiation recombination of generated electrons and positive holes are promoted. Therefore, it is difficult to achieve a high performance of a solar cell by applying the technique disclosed in Paten Document 1. Such problems are difficult to be solved even though GaNAs is used as the semiconductor of the technique disclosed in Patent Document 1.

Accordingly, an object of the present invention is to provide a photovoltaic device prepared with a semiconducting material including a localized level or an intermediate band in a forbidden band, the photovoltaic device being capable of improving performance than the conventional techniques, and a method for manufacturing the photovoltaic device.

Means for Solving the Problems

The inventors of the present invention have found out followings as a result of intensive studies: in a photovoltaic device prepared with a first layer made of a first semiconducting material and a second layer made of a second semiconducting material including a localized level or an intermediate band in a forbidden band, it is possible to form a clear intermediate band which continues into the direction to which an electric field is applied, by alternately laminating a plurality of the first layer and a plurality of the second layer in a direction to which the electric field is applied and by making the second layer have a predetermined thickness. Since it is possible to easily make excited electrons by light absorbing exist in the intermediate band by forming a clear intermediate band, it is possible to improve the performance of the photovoltaic device. The present invention has been made based on the above findings.

In order to solve the above problems, the present invention takes following means.

Namely, a first aspect of the present invention is a photovoltaic device comprising: a plurality of first layers made of a first semiconducting material; and a plurality of second layers made of a second semiconducting material that is different from the first semiconducting material, wherein the second semiconducting material includes a localized level or an intermediate band in a forbidden band; the first layers and the second layers are alternately laminated one by one; at least two of the second layers are each disposed between a pair of the first layers; and each of the second layers is thinner than a thickness of four molecular layers of the first semiconducting material.

Here, in the first aspect of the present invention and other aspects of the present invention shown below, the term "thickness of four molecular layers of the first layer" means a fourfold thickness of a thickness of one molecular layer of the first semiconducting material. In other words, it is a double thickness of the lattice constant of the first semiconducting material. For example, in a case where the first semiconductor is GaAs, the thickness of two molecular layers (the lattice constant of GaAs) is 0.5653 nm, therefore the thickness of four molecular layers of the first semiconducting materials is 0.5653×2=1.1306 nm. By making the second layer thinner than a thickness of the four molecular layers of the first semiconducting material, it becomes possible to uniformize the composition of the second layer in a thickness direction, and via the first layer, by repeatedly and periodically laminating a plurality of second layers each having the thickness described above, it becomes possible to form a clear intermediate band in the forbidden band. By forming a clear intermediate band in the forbidden band, function of the intermediate band where electrons are going to exist becomes easy to be expressed, therefore it becomes possible to improve the performance of the photovoltaic device.

Also, in the first aspect of the present invention, it is preferred that the second semiconducting material is same as the first semiconducting material except that a part of elements configuring the first semiconducting material is substituted by an additive element having a different electronegativity from that of the elements configuring the first semiconducting material (Highly Missmatched Alloys: HMA). Such a configuration makes it possible to configure a photovoltaic device whose performance is improved with a few kinds of elements.

In the first aspect of the present invention, when defining a thickness of each of the first layers as w1 and a thickness of each of the second layers as w2, preferably 3.3 nm≤w1+w2 ≤20 nm. By having a configuration of 3.3 nm≤w1+w2, it becomes easy to form an $E_+$ band of the second semiconducting material to a higher side of energy than an end of a conduction band of the first semiconducting material of bulk, and by having a configuration of w1+w2≤20 nm, it becomes easy to form a clear intermediate band in a forbidden band. Therefore, by having such configurations, it becomes easy to improve the performance of the photovoltaic device.

In the first aspect of the present invention, when defining the thickness of each of the first layers as w1 and the thickness of the second layer as w2, preferably 0.05≤w2/(w1+w2)≤0.30. By having a configuration of 0.05≤w2/(w1+w2), it becomes easy to form a clear intermediate band in the forbidden band, and by having a configuration of w2/(w1+w2)≤0.30, it becomes easy to form an $E_+$ band of the second semiconducting material to a higher side of energy than an end of a conduction band of the first semiconducting material of bulk. Therefore, by having such configurations, it becomes easy to improve the performance of the photovoltaic device.

In the first aspect of the present invention, a concentration of the additive element to the entirety of the first layers and the second layers is preferably 0.10% or more and 2.0% or less. By having the concentration of the additive element of 0.10% or more, it becomes easy to form an intermediate band, and by having the concentration of the additive element of 2.0% or less, it becomes easy to inhibit deterioration of crystallinity due to addition of the additive element. Therefore, by having such a configuration, it becomes easy to improve the performance of the photovoltaic device.

In the first aspect of the present invention, the first semiconducting material may be GaAs, the second semiconducting material may be $GaN_xAs_{1-x}$ and 0.003≤x≤0.4. This configuration also makes it possible to provide a photovoltaic device whose performance is improved.

In the first aspect of the present invention in which the first semiconducting material is GaAs, the second semiconducting material is $GaN_xAs_{1-x}$ and 0.003≤x≤0.4, it is preferable that Si is doped in the first layer. By having this configuration, it becomes easy to improve the electron occupancy in the intermediate band, whereby it becomes easy to improve the performance of the photovoltaic device.

A second aspect of the present invention is a method for manufacturing a photovoltaic device, the method comprising the steps of: forming a first layer on a base material, the first layer being made of a first semiconducting material; forming a second layer on a surface of the first layer, the second layer having a thickness thinner than a thickness of four molecular layers of the first semiconducting material and being made of a second semiconducting material that is different from the first semiconducting material, by going through a process of supplying a part of elements configuring the first semiconducting material and an additive element having a different electronegativity from that of the elements configuring the first semiconducting material, the additive element generating a localized level or an intermediate band in a forbidden band; forming a first layer on a surface of the second layer, the first layer being made of the first semiconducting material; forming a secondary second layer on the first layer formed on the surface of the second layer, the secondary second layer having a thickness thinner than the thickness of four molecular layers of the first semiconducting material and being made of the second semiconducting material, by going through a process of supplying a part of elements configuring the first semiconducting material and the additive element; and forming a first layer on a surface of the secondary second layer, the first layer being made of the first semiconducting material.

According to the second aspect of the present invention, it is possible to manufacture the photovoltaic device according to the first aspect of the present invention described above. Therefore, according to the second aspect of the present invention, it is possible to provide a method for manufacturing a photovoltaic device by which a photovoltaic device prepared with a semiconductor including a localized level or an intermediate band in a forbidden band and whose performance is improved than before can be manufactured.

In the second aspect of the present invention, when defining a thickness of the first layer as w1 and a thickness of the second layer as w2, it is preferable that the step of forming the first layer and the step of forming the second layer are controlled to have a configuration of 3.3 nm≤w1+w2≤20 nm. Here, "the step of forming the first layer" to be controlled includes all steps of forming each of the first layers included in the photovoltaic device, and "the step of forming the second layer" to be controlled includes all steps of forming each of the second layers included in the photovoltaic device. The same is applied hereinafter. In the second aspect of the present invention, "the step of forming the first layer is controlled" means, for example, that the speed/flow amount of supplying and supply time of the raw material to be used in forming the first layer are controlled. Also, in the second aspect of the present invention, "the step of forming the second layer is controlled" means, for example, that the speed/flow amount of supplying and supply time of the raw material to be used in forming the second layer are controlled. By having a configuration of 3.3 nm≤w1+w2, it becomes easy to form an E+ band of the second semiconducting material on a higher side of energy than an end of a conduction band of the first semiconducting material of bulk, and by having a configuration of w1+w2≤20 nm, it becomes easy to form a clear intermediate band in the forbidden band. Therefore, by having such configurations, it becomes easy to improve the performance of the photovoltaic device.

In the second aspect of the present invention, when defining the thickness of the first layer as w1 and the thickness of the second layer as w2, it is preferable that the step of forming the first layer and the step of forming the second layer are controlled to have a configuration of 0.05≤w2/(w1+w2)≤0.30. By having a configuration of 0.05≤w2/(w1+w2), it becomes easy to form a clear intermediate band in a forbidden band, and by having a configuration of w2/(w1+w2)≤0.30, it becomes easy to form an $E_+$ band of the second semiconducting material on a higher side of energy than the end of the conduction band of the first semiconducting material of bulk. Therefore, by having such configurations, it becomes easy to improve the performance of the photovoltaic device.

In the second aspect of the present invention, it is preferable to control the step of forming the first layer and the step of forming the second layer such that a concentration of the additive element to the entirety of the first layer and the second layer is 0.10% or more and 2.0% or less. By having the concentration of the additive element of 0.10% or more, it becomes easy to form an intermediate band, and by having the concentration of 2.0% or less, it becomes easy to inhibit deterioration of crystallinity due to addition of the additive element, therefore, by having this configuration, it becomes easy to improve the performance of the photovoltaic device.

In the second aspect of the present invention, the first semiconducting material may be GaAs, the second semiconducting material may be $GaN_xAs_{1-x}$ and the additive element may be N, and the step of forming the second layer may be controlled so that x satisfies 0.003≤x≤0.4. This configuration also makes it possible to manufacture a photovoltaic device whose performance is improved.

Also, in the second aspect of the present invention in which the first semiconducting material is GaAs, the second semiconducting material is $GaN_xAs_{1-x}$ and the additive element is N, and the step of forming the second semiconducting layer is controlled so that x satisfies 0.003≤x≤0.4, in the step of forming the first layer, it is preferable to form the first layer made of the first semiconducting material in which Si is doped. Since this configuration makes it possible to improve the electron occupancy in the intermediate band, it becomes easy to manufacture a photovoltaic device whose performance is improved.

Effects of the Invention

According to the present invention, it is possible to provide a photovoltaic device prepared with a semiconductor including a localized level or an intermediate band in a forbidden band, the photovoltaic device being capable of improving the performance than before, and a method for manufacturing the photovoltaic device.

BRIEF DESCRIPTION OF THE DRAWINGS

FIG. 2 is a view to describe an energy band structure of alight absorbing layer 3.

MODES FOR CARRYING OUT THE INVENTION

Hereinafter, the present invention will be described with reference to the drawings. Some of the repeating numerals may be omitted in the following drawings. It should be noted that the configurations shown below are examples of the present invention and that the present invention is not limited to the configurations.

Figure 1:
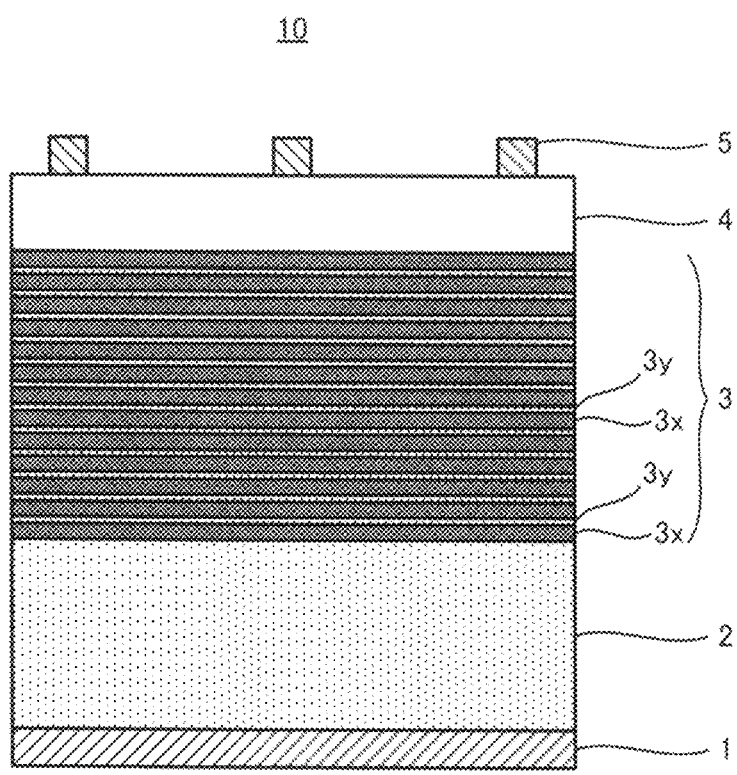
FIG. 1 is a view to describe a photovoltaic device 10.

FIG. 1 is a view to explain a configuration of the photovoltaic device of the present invention. A photovoltaic device 10 shown in FIG. 1 includes a backside electrode 1, a p-type substrate 2 connected to the backside electrode 1, alight absorbing layer 3 formed on a surface of the p-type substrate 2, an n layer 4 formed on a surface of the light absorbing layer 3 and a comb-shaped electrode 5 formed on a surface of the n layer 4. The light absorbing layer 3 includes a plurality of first layers 3x, 3x, . . . each made of the first semiconducting material and a plurality of second layers 3y, 3y, . . . each made of the second semiconducting material, and is produced by undergoing a process in which the second layers 3y each having a thickness thinner than a thickness of four molecular layers of the first semiconducting material and the first layers 3x are alternatively and repeatedly formed. The first layers 3x, 3x, . . . (hereinafter simply referred to as "the first layer 3x") is made of GaAs that is the first semiconducting material, and the second layers 3y, 3y, . . . (hereinafter simply referred to as "the second layer 3y") is made of $GaN_xAs_{1-x}$ (0.003≤x≤0.4. The same is applied hereinafter) that is the second semiconducting material being same as the first semiconducting material except that a part of As configuring the first layer 3x is substituted by N. The N concentration in the light absorbing layer 3 is made to be 0.10% or more and 2.0% or less, and around $10^{17}$ or more and $10^{18}$ or less of Si atoms are doped per 1 $cm^3$ of the first layer 3x.

When a thickness (a thickness in the vertical direction of the paper surface of FIG. 1. The same is applied hereinafter) of the first layer 3x is defined as w1 and a thickness of the second layer 3y is defined as w2, the photovoltaic device 10 has a configuration of 3.3 nm ≤w1+w2≤20 nm and 0.05≤w2/(w1+w2)≤0.30. Further, in the photovoltaic device 10, by controlling a flow amount and supply time of raw materials (Ga source and As source) to be supplied in producing the first semiconducting material, each of the first layers 3x, 3x, . . . has a substantially same thickness.

FIG. 2 is a view to explain a band structure of the light absorbing layer 3. The horizontal direction of the paper surface of FIG. 2 corresponds to the vertical direction of the paper surface of FIG. 1. In FIG. 2, $E_v$ is an end of a valence band of GaAs of bulk, $E_c$ is an end of a conduction band of GaAs of bulk, $E_-$ is a level of an intermediate band of GaN$_x$As$_{1-x}$ produced by means of a conventional method, and $E_+$ is a level of the GaN$_x$As$_{1-x}$ produced by means of a conventional method which is to be formed on a higher side of energy than $E_c$. Also, in FIG. 2, $E_+'$ is a level of an intermediate band of the second layer 3y, the intermediate level being formed on a higher side of energy than $E_c$ and formed in the forbidden band of the second layer 3y, $E_-'$ is a level of an intermediate band of the second layer 3y formed in the forbidden bands of the first layer 3x and the second layer 3y, and $E_{c1}$ and $E_{c2}$ are levels of the first layer 3x formed on a higher side of energy than Ec.

As shown in FIG. 2, the second layer 3y has a localized level or an intermediate band. Here, the thickness of the second layer 3y is thinner than the thickness of four molecular layers of the first semiconducting material, and N atom is contained in the second layer 3y but not contained in the first layer 3x. By having the thickness of the second layer 3y thinner than the thickness of four molecular layers of the first semiconducting material, even though unevenness or the like on a surface of the first layer 3x where the second layer 3y is to be formed is considered, it is possible to dispose one N atom to a thickness direction of the second layer 3y and keep this state. Further, as mentioned above, since the thicknesses of all of the first layers 3x, 3x, . . . are substantially same, in the photovoltaic device 10, it becomes possible to make each distance between N atoms adjacent in a direction in which an electric field is to be applied substantially same. In addition, the first layer 3x is made to have a thickness such that a wave function of electrons existing in the intermediate band of one of a pair of the second layers 3y, 3y sandwiching the first layer 3x and a wave function of electrons existing in the intermediate band of the other of the pair of the second layers 3y, 3y overlap each other (the thickness is 20 nm or less). Therefore, the intermediate bands of the second layers 3y, 3y spread to the entirety of a thickness direction (the vertical direction of the paper surface of FIG. 1) of the light absorbing layer 3, and a superlattice mini band (a clear intermediate band) is formed in the light absorbing layer 3.

As described above, according to the photovoltaic device 10, since a clear intermediate band can be formed, it is possible to improve the performance than that of a conventional photovoltaic device prepared with a semiconducting material including an intermediate band.

Figure 3A:
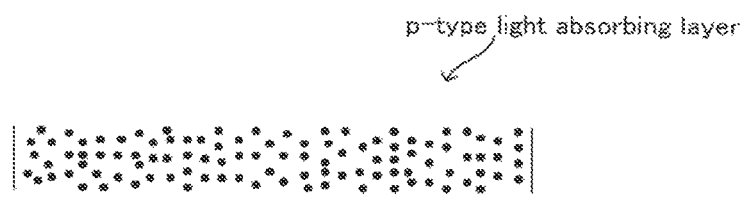
FIG. 3A is a view to describe a light absorbing layer of a conventional photovoltaic device.
Figure 3B:
FIG. 3B is a view to describe the light absorbing layer 3.

FIG. 3A is a view to explain a part of a p-type light absorbing layer in the conventional photovoltaic device prepared with a semiconducting material including an intermediate band being simplified, and FIG. 3B is a view to explain a part of the light absorbing layer 3 being simplified. The vertical direction of the paper surface of FIGS. 3A and 3B is a thickness direction of the layers. Filled circles in FIGS. 3A and 3B show additive elements.

As shown in FIG. 3A, in a conventional photovoltaic device, a thickness of the p-type light absorbing layer is made to be thick as around 100 nm for example, and the additive elements are contained in the entire area of the thickness. Since it is difficult to uniformly distribute the additive elements not only in an in-plane direction of the layer but also in a thickness direction, conventionally, it tended to have variations in distances between adjacent atoms of the additive elements in the thickness direction. If the distances between the atoms of additive elements vary, a point where the atoms of additive elements exist having a distance is created, therefore it was difficult to form an intermediate band over the entirety of the thickness direction of the layer.

On this issue, as shown in FIG. 3B, in the light absorbing layer 3, the place where the additive elements are to be contained is limited to the second layers 3y, 3y, . . . each having a thickness thinner than the thickness of four molecular layers of the first semiconducting material, and no additive elements are contained in the first layers 3x, 3x, . . . . By containing the additive elements as described above, it becomes possible to control the distance between the atoms of the additive elements adjacent to each other in the thickness direction to be substantially same, whereby it becomes possible to form an intermediate band over the entirety of the thickness direction of the layer.

Figure 4:
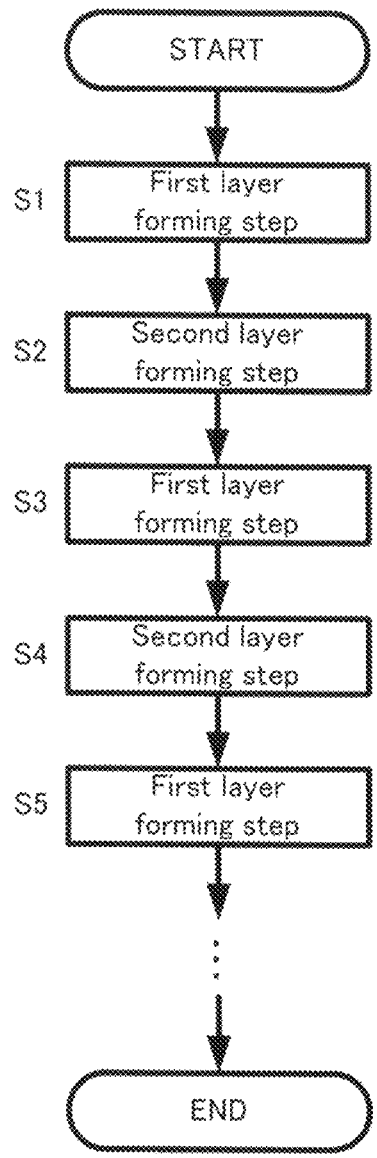
FIG. 4 is a view to describe a production method of the light absorbing layer 3.

The light absorbing layer 3 configured as above may be produced by going through the following process for example. FIG. 4 explains a production form of the light absorbing layer 3. As shown in FIG. 4, the light absorbing layer 3 is produced by going through a first layer forming step (S1), a second layer forming step (S2), a first layer forming step (S3), a second layer forming step (S4), and a first layer forming step (S5) for example.

The first layer forming step S1 (hereinafter referred to as "S1") is a step to form a first layer 3x made of the first semiconducting material on a surface of a base material. For example, S1 may be a step in which a Ga source and an As source are supplied to a surface of a GaAs (001) substrate (p-type substrate 2) for a predetermined period to form the first layer 3x by means of metal organic vapor phase epitaxy (MOVPE).

The second layer forming step S2 (hereinafter referred to as "S2") is a step to form a second layer 3y on a surface of the first layer 3x formed in S1, the second layer 3y being made of the second semiconducting material and having a thickness thinner than the thickness of four molecular layers of the first semiconducting material. For example, S2 may be a step in which an N source and an As source are supplied to the surface of the first layer 3x formed in S1 for a predetermined period to form the second layer 3y by means of metal organic vapor phase epitaxy (MOVPE).

The first layer forming step S3 (hereinafter referred to as "S3") is a step to form a first layer 3x on a surface of the second layer 3y formed in S2, the first layer 3x being made of the first semiconducting material. S3 may be a step to form the first layer 3x in the same manner as in the above S1 except that the second layer 3y formed in S2 is used as a base material to form the first layer 3x.

The second layer forming step S4 (hereinafter referred to as "S4") is a step to form a second layer 3y on a surface of the first layer 3x formed in S3, the second layer 3y being made of the second semiconducting material and having a thickness thinner than the thickness of four molecular layers of the first semiconducting material. S4 may be a step to form the second layer 3y in the same manner as in the above S2 except that the second layer 3y is formed on the surface of the first layer 3x formed in S3.

The first layer forming step S5 (hereinafter referred to as "S5") is a step to form the first layer 3x on a surface of the second layer 3y formed in S4, the first layer 3x being made of the first semiconducting material. S5 may be a step to form the first layer 3x in the same manner as in S1 and S3 described above except that the second layer 3y formed in S4 is used as a base material to form the first layer 3x.

The light absorbing layer 3 can be produced afterward by repeating the second layer forming step and the first layer forming step depending on the times of repeatedly laminating the first layer 3x and the second layer 3y. After producing the light absorbing layer 3 as above, an n-layer 4 (for example, an n-type GaAs) is formed by a known method. Subsequently, going through the process of: forming a comb-shaped electrode 5 being made of a known material which can be used for an electrode of a photovoltaic device; and forming a backside electrode 1 on a surface of the p-type substrate 2, the backside electrode 1 being made of a known material which can be used for an electrode of a photovoltaic device, whereby a photovoltaic device 10 can be manufactured.

A configuration in which the second semiconducting material ($GaN_xAs_{1-x}$) in which a part of element (As) configuring the first semiconducting material is substituted by an additive element (N) having a different electronegativity from elements (Ga, As) configuring GaAs which is the first semiconducting material is exemplified in the above explanation. However, the photovoltaic device of the present invention and the method for manufacturing the photovoltaic device (hereinafter simply referred to as "the present invention") is not limited to this configuration. However, in view of having a configuration in which a photovoltaic device prepared with HMA and whose performance is improved can be made of a few kinds of elements and in similar views, the second semiconducting material is preferably a material in which a part of elements configuring the first semiconducting material is substituted by an additive element having an electronegativity different from that of the elements configuring the first semiconducting material.

Also, in the above explanation, although a configuration in which the thickness w1 of the first layer 3x and the thickness w2 of the second layer 3y satisfy 3.3 nm≤w1+w2≤20 nm is exemplified, the present invention is not limited to this configuration. However, preferably 3.3 nm≤w1+w2 in view of having a configuration in which the $E_+$ band of the second semiconducting material is easy to be formed on a higher side of energy than the end of the conduction band of the first semiconducting material of bulk, by inhibiting the variations in distances between atoms of the additive elements which used to occur in a conventional technique for example. Further, in view of having a configuration in which an intermediate band is easy to be formed in the forbidden band and the like, preferably w1+w2≤20 nm.

Also, in the above explanation, although a configuration wherein, when the thickness of the first layer 3x is w1 and the thickness of the second layer 3y is w2, w2/(w1+w2) satisfies 0.05≤w2/(w1+w2)≤0.30 is exemplified, the present invention is not limited to this configuration. However, in view of having a configuration in which a clear intermediate band is easy to be formed in the forbidden band and the like, preferably 0.05≤w2/(w1+w2). Further, in view of having a configuration in which the $E_+$ band of the second semiconducting material is easy to be formed on a higher side of energy than the end of the conduction band of the first semiconducting material of bulk and the like, preferably w2/(w1+w2)≤0.30.

Also, in the above explanation, although a configuration in which the N concentration in the light absorbing layer 3 (a concentration of the additive element N to the entirety of the first layer 3x and the second layer 3y) is 0.10% or more and 2.0% or less is exemplified, the present invention is not limited to this configuration. However, in view of having a configuration in which a clear intermediate band is easy to be formed in the forbidden band and the like, the concentration of the additive element to the entirety of the first layer and the second layer is preferably 0.10% or more. Further, in view of having a configuration in which a photovoltaic device whose performance is improved is easy to be provided by inhibiting deterioration of crystallinity due to addition of the additive element and the like, the concentration of the additive element to the entirety of the first layer and the second layer is preferably 2.0% or less.

Also, in the above explanation, a configuration in which the first semiconducting material is GaAs, the second semiconducting material is $GaN_xAs_{1-x}$ and 0.003≤x≤0.4 is exemplified, however, the present invention is not limited to this configuration. ZnTe and the like can be used as the first semiconducting material, and when ZnTe is used as the first semiconducting material, $ZnTe_{1-x}O_x$ (0<x<1) can be used as the second semiconducting material. However, in a case where the first semiconducting material is GaAs and the second semiconducting material is $GaN_xAs_{1-x}$, in view of having a configuration in which an intermediate band is easy to be formed in the forbidden band and the like, preferably 0.003≤x. Further, in view of having a configuration in which a photovoltaic device whose performance is improved is easy to be provided by inhibiting deterioration of crystallinity due to addition of excessive amount of N and the like, preferably x≤0.4.

Also, in the above explanation, although a configuration in which about $10^{17}$ or more and $10^{18}$ or less per 1 $cm^3$ of Si atoms are doped in the first layer 3x made of GaAs is exemplified, the present invention is not limited to this configuration. However, in view of having a configuration in which the performance of a photovoltaic device is easy to be improved by making the level of the intermediate band created in the forbidden band close to the Fermi level to make electrons easy to exist in the intermediate band and the like, about $10^{17}$ or more and $10^{18}$ or less per 1 $cm^3$ of Si atoms may be doped in the first layer made of GaAs.

EXAMPLES

The present invention will be further described with reference to results of Example and Comparative Example of the present invention.

1. Example 1.1 Sample Production

On a GaAs (001) substrate, layers correspond to the first layer (GaAs) and the second layer ($GaN_xAs_{1-x}$) to be provided to the photovoltaic device of the present invention were alternately produced by means of metal organic vapor phase epitaxy (MOVPE) whereby a light absorbing layer including the first layer and the second layer that are alternately laminated was produced. Trimethylgallium (hereinafter referred to as "TMGa") as a Ga source, tertiarybutylarsine (hereinafter referred to as "TBAs") as a As source, and dimethylhydrazine (hereinafter referred to as "DMHy") as an N source were employed. In producing the first layer, TMGa and TBAs were supplied at the same time for a predetermined period. After that, supply of TMGa was stopped before producing a second layer, and after stopping supplying TMGa, the second layer was produced by means of supplying DMHy and TBAs at the same time for a predetermined period (by supplying pulses of the As source and the N source at the same time). Consequently, supply of DNHy was stopped before producing a first layer, and TMGa and TBAs were supplied in producing the first layer. In the manner described above, thirty layers of first layers and thirty layers of second layers were alternately laminated to produce the light absorbing layer formed on the GaAs (001) substrate, and a GaAs layer was formed on the produced light absorbing layer. Characteristics of the light absorbing layer are shown in Table 1.

TABLE 1

| | |
|---|---|
| thickness of the first layer | 6.5 nm |
| each laminated numbers of the first layer and the second layer | 30 |
| surface density of nitrogen atom per layer | $2.5 \times 10^{13}$ cm$^{-2}$ |
| average nitrogen composition | 0.17% |

In Table 1, the "surface density of nitrogen atom per layer" means a surface density of nitrogen atom added to a surface of the first layer where the second layer is to be formed (=a surface density of nitrogen atom in the second layer), and the "average nitrogen composition" means a ratio of N (nitrogen concentration) to the entirety of the light absorbing layer. The thickness of the first layer, the number of layers and the surface density of nitrogen atom per layer shown in Table 1 are estimated from results of secondary ion mass spectrometry described below, and the average nitrogen composition was estimated from results of X-ray diffraction (XRD) θ/2θ measurement described below.

1.2. Secondary Ion Mass Spectrometry

Figure 5:
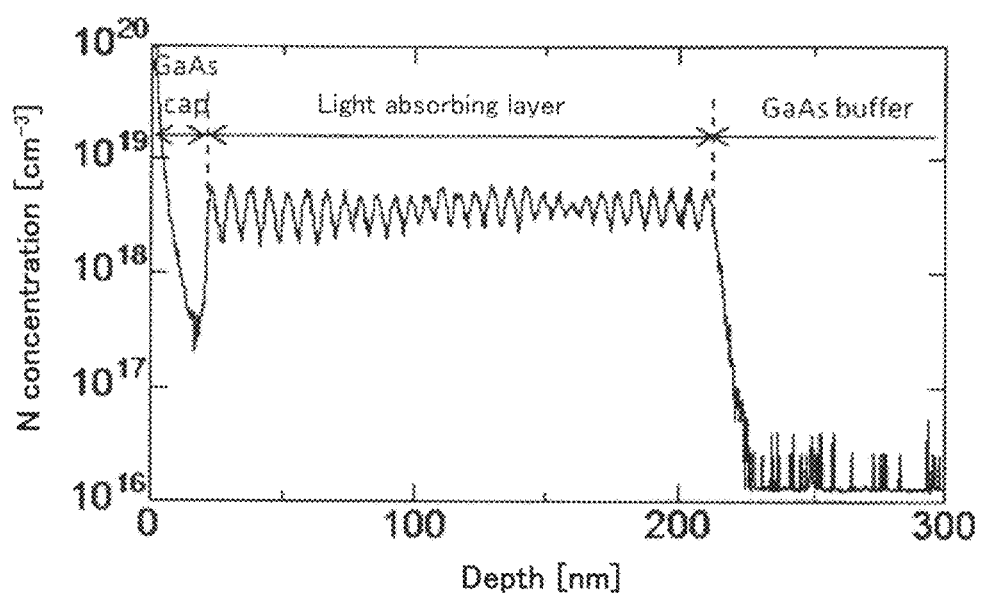
FIG. 5 is a view to show a result of a secondary ion mass spectrometry.

The secondary ion mass spectrometry (SIMS) was carried out to the sample produced by the above method (hereinafter referred to as "sample of Example"). The result is shown in FIG. 5. N concentration [cm$^{-3}$] is taken along the vertical axis and depth [nm] is taken along the horizontal axis in FIG. 5. From FIG. 5, a periodic structure which shows that the first layers and the second layers were alternately laminated for thirty times was confirmed, and the nitrogen concentration of GaAs layer was equal to or less than a detection limit.

1.3. X-ray Diffraction (XRD, θ/2θ method) Measurement

Figure 6:
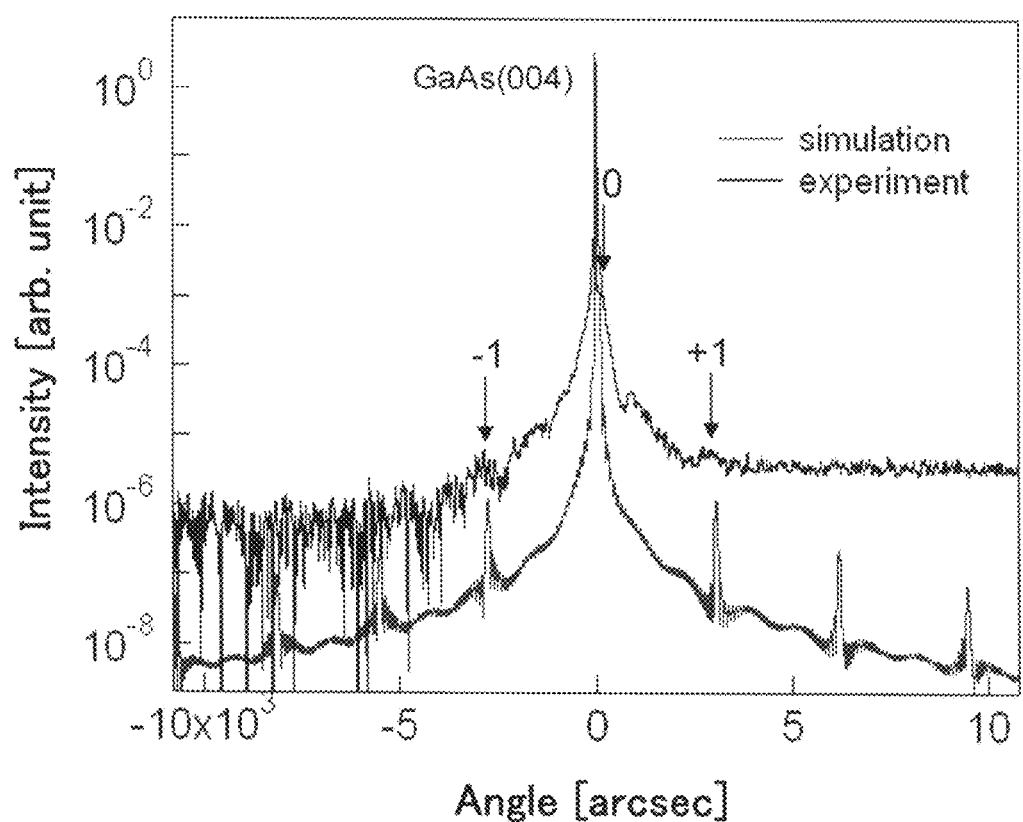
FIG. 6 is a view to show a result of X-ray diffraction measurement and a dynamics simulation.

X-ray diffraction measurement (θ/2θ method measurement) was carried out to the sample of Example. The result is shown in FIG. 6. In FIG. 6, an analysis pattern obtained from a dynamics simulation based on a structural parameter estimated from the secondary ion mass spectrometry (SIMS) is also shown. The result of X-ray diffraction measurement is shown on the upper side of the FIG. 6, and the result of the dynamics simulation is shown on the lower side. Intensity [arb.unit] is taken along the vertical axis and angle [arcsec] is taken along the horizontal axis of FIG. 6.

Since the average nitrogen composition of the sample of Example was small as 0.17%, the zero-order peak of X-ray satellite of superlattice was positioned very close to the GaAs (004) peak, and could not be separated from the diffraction peak of the substrate as shown in FIG. 6. However, as shown in FIG. 6, the +1-order peak of X-ray satellite and −1-order peak of X-ray satellite were observed. Therefore, it was confirmed that the sample of Example had a periodic structure.

1.4. Photoreflectance Spectroscopy (PR spectroscopy) Measurement

Photoreflectance spectroscopy measurement (hereinafter referred to as PR spectroscopy measurement) was carried out to the sample of Example. The photoreflectance spectroscopy measurement is a kind of the modulation spectroscopy, and is a method using an excitation light for modulation in carrying out a reflection spectrometric measurement to measure a spectrum of reflectance change (ΔR/R) at the time when the excitation light is irradiated and when the light is not irradiated.

Figure 7:
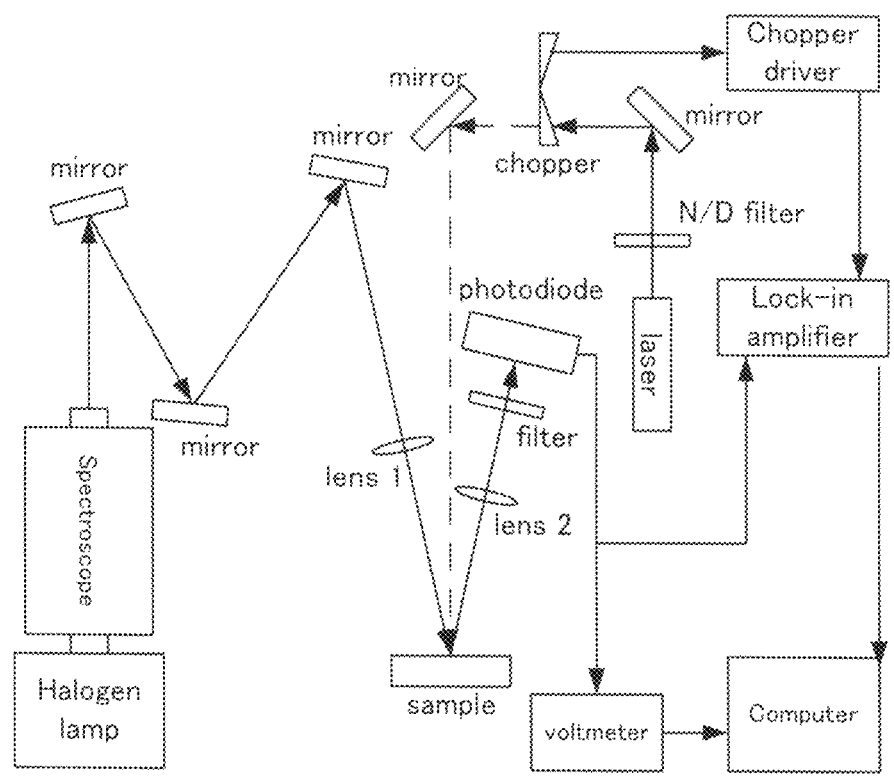
FIG. 7 is a view to explain a measurement system and each device used for a measurement by a photoreflectance spectroscopy.

FIG. 7 shows the measurement system and each device employed to the spectroscopy measurement carried out this time. As shown in FIG. 7, a light from a halogen lamp dispersed by means of a spectroscope (CT-50C, 600 l/mm, blaze wavelength of 500 nm, manufactured by JASCO Corporation) was employed as a prove light. The slit width of the spectroscope was 1.6 mm, and the wavelength resolving power was 2 nm. A photodiode (UV/IR large area photoreceiver 2031M, 2034M, manufactured by Japan Laser Corporation) was employed for detection of a reflecting light. In order to prevent entrance of scattered light from the laser for modulation to the photodiode, a low pass filter capable of cutting the wavelength of 550 nm was disposed between the photodiode and the sample. A DPSS laser having a wavelength of 532 nm was employed as a modulated radiation. The sample was placed in a cryostat that can cool the sample to 15K.

Figure 8:
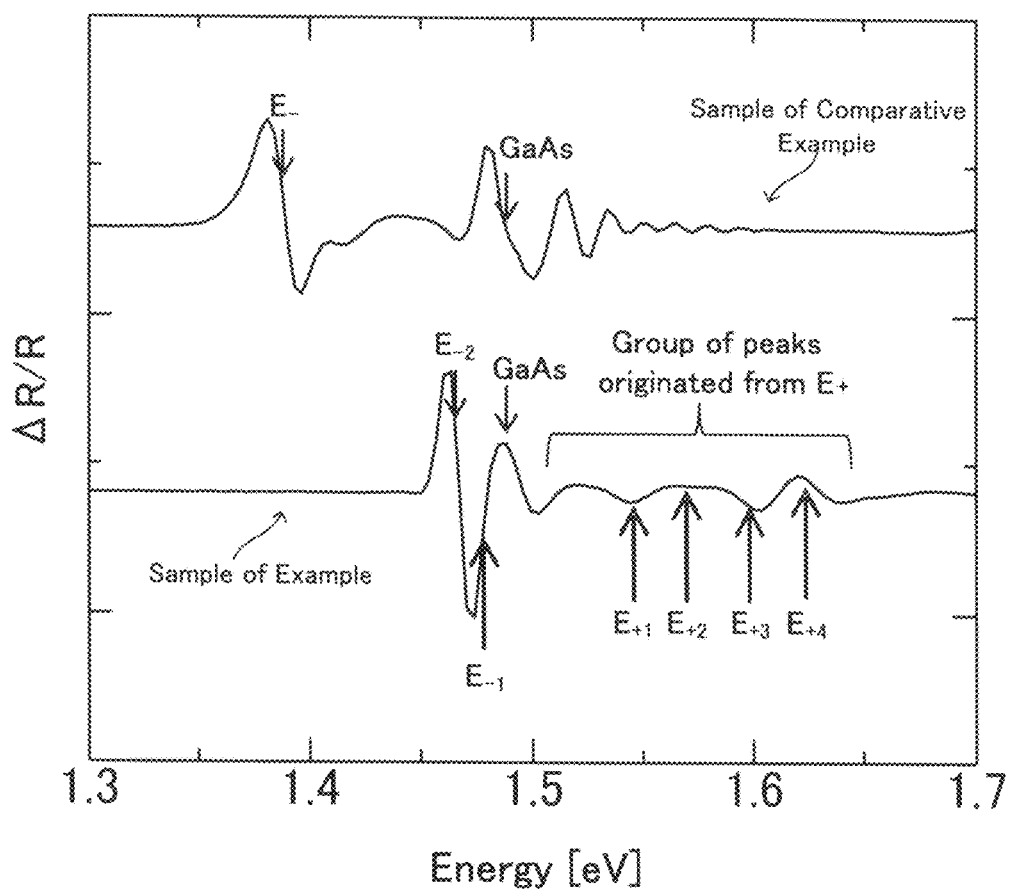
FIG. 8 is a view to show measurement results of the photoreflectance spectroscopy.

Results of the PR spectroscopy measurement are shown in FIG. 8. The reflectance change ΔR/R is taken along the vertical axis and the energy [eV] is taken along the horizontal axis. Transition energies obtained from the PR spectrum by fitting are shown by arrows in FIG. 8. Also, regarding $GaN_{0.0043}As_{0.9957}$ (in the following explanation regarding FIG. 3, referred to as "sample of Comparative Example") produced by a conventional method (a method in which a Ga source, an As source and an N source are continuously supplied), a result of the PR spectrum carried out in the same manner as above is shown together. The result of the Comparative Example is shown on the upper side of the paper surface of the FIG. 8, and the result of Example is shown on the lower side.

As shown in FIG. 8, in the sample of Example, transition peaks ($E_{-1}$, $E_{-2}$) was observed at 1.46 eV and 1.48 eV that are lower energies than the transition between bands of GaAs. It is presumed that the transition peaks are originated from the $E_{-}$ band (intermediate band). Since the bandgap of $GaN_{0.0017}As_{0.9983}$ produced by continuously supplying a Ga source, an As source and an N source is 1.43 eV, the two transition peaks originated from the $E_{-}$ band are both appeared to a higher side of energy than the bandgap.

Also, as shown in FIG. 8, in the sample of Example, a plurality of transition peaks presumed to be originated from the $E_{+}$ band were observed in a range of 1.55 eV or more and 1.64 eV or less which is on a higher side of energy than the transition between bands of GaAs. These have lower energies than the localized level (1.71 eV) of nitrogen to be formed in GaAs.

Further, as shown in FIG. 8, comparing the sample of Example and the sample of Comparative Example in ratio of the peaks originated from the $E_{+}$ band and the peak originated from the $E_{-}$ band, the ratio of the sample of Example is almost three times larger than that of the sample of Comparative Example, and the sample of Example had a much stronger signal intensity of the high energy potential than that of the sample of Comparative Example. Therefore, it was found out that a clear intermediate band is formed in the sample of Example, comparing with a case in which a sample is produced by the conventional method.

The electronic structure observed in the sample of Example can be explained by formation of a quantum level due to carrier trapping to both the first layer and the second layer and a formation of a superlattice mini band due to the periodic structure of the first layer and the second layer. It will be explained hereinafter with reference to FIG. 2.

Circumference of layers formed by supplying an N source has an electronic structure of a mixed crystal of $GaN_xAs_{1-x}$. In the sample of Example, an intermediate band ($E_{-}$' band)

is formed between $E_c$ and $E_v$ and on a higher side of energy than the intermediate band formed in GaNAs produced by the conventional method, and an $E_+'$ band is formed on a higher side of energy than $E_c$. Here, as shown in FIG. 2, the energy of the $E_-'$ band and the quantum level formed in the first layers sandwiching the second layer are not identical. Therefore, the first layer functions as an energy barrier of the electrons existing in the $E_-'$ band. Also, since the thickness of the second layer is very thin which is thinner than the thickness of four molecular layers of the GaAs, the quantum level is formed due to an effect of quantum trapping. On the other hand, in a case of GaAs of bulk, electrons can exist in the region same as and higher than $E_c$ of energy, however, since the light absorbing layer of the present invention has the second layer between a pair of adjacent first layers in a direction to which the electrical field is applied, there is an energy gap between the $E_+'$ band and the $E_-'$ band formed in the second layer. As shown in FIG. 2, there is an energy gap between the $E_+'$ band and the $E_-'$ band of the second layer and the quantum level formed in the first layer. Therefore, the second layer functions as an energy barrier of the electron existing in the conduction band (quantum level) of the first layer.

Since the first layer of the sample of Example has a thickness of 6.5 nm, a quantum level is formed in the same manner as in the second layer, and the first layer and the second layer thinner than the first layer are alternately laminated to form a superlattice structure. Therefore, a wave function of the electrons in the quantum level spreads to the entirety of the superlattice function, thereby forming a superlattice mini band. Supposing that the electron transition between the superlattice mini band and the valence band is detected as the PR signal shown in FIG. 8, it can be explained that the two transition peaks originated from the $E_-$ band of the sample of Example are observed on a higher side of energy than the bandgap of $GaN_{0.0017}As_{0.9983}$ produced by continuously supplying a Ga source, an As source and an N source and that the group of peaks originated from the $E_+$ band of the sample of Example is observed on a lower side of energy than the localized level of nitrogen.

Figure 9:
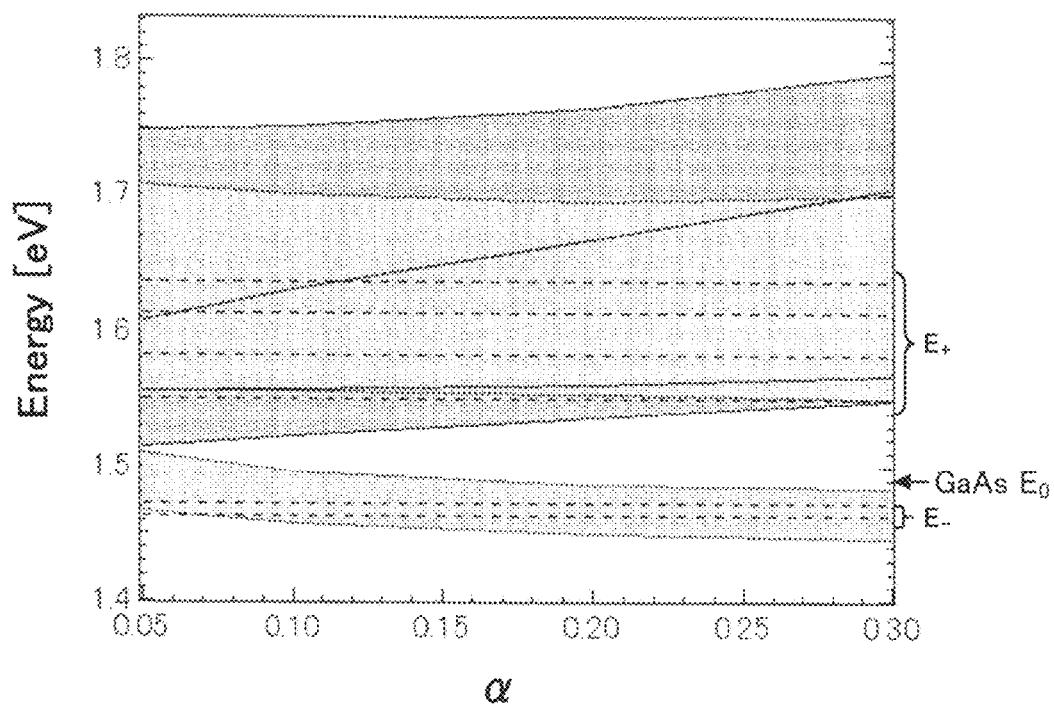
FIG. 9 is a view to together show an analysis result and an experimental result.

FIG. 9 is a view to show a result of analysis of the energy position of the supserlattice mini band from Kronig-Penny model. The energy [eV] is taken along the vertical axis of FIG. 9 and a ratio α that is a ratio of the thickness w2 of the second layer to a sum of the thickness w1 of the first layer and the thickness w2 of the second layer, w1+w2 (α=w2/(w1+w2)). In this analysis, the nitrogen concentration in the GaNAs region corresponding to the second layer was determined so that the average nitrogen composition to α is identical to the measured value regarding the sample of Example, and energies of the $E_+$ band and the $E_-$ band were obtained from BAC (Band anti crossing) model. Also, in the analysis, the electron mobility was considered to be equal to the value of the electron mobility in GaAs over the entirety of the superlattice. Transition energies estimated from the results of the PR spectrum shown in FIG. 8 is shown by dashed lines in FIG. 9. As shown in FIG. 9, in the range of α=0.05 or more and 0.30 or less, the lower end energy of the superlattice mini band originated from the ground level of the second layer was 1.45 to 1.47 eV and the lower end energies of the other super lattice minibands were 1.5 to 1.65 eV. These values are mostly identical to the transition energy observed in FIG. 8. Therefore it is considered that the sample of Example has the energy structure shown in FIG. 2. It should be noted that, in this analysis, the band offset of the valence band, the separation of heavy hole band and light hole band due to distortion and the like are not considered.

These are considered to be reasons of a slight difference between the experimental value and the analysis.

2. Comparative Example 2.1 Sample Production

On a GaAs (001) substrate, $GaN_xAs_{1-x}$ was grown by means of metal organic vapor phase epitaxy (MOVPE). TMGa as a Ga source, TBAs as an As source and DMHy as an N source were employed. These were supplied to a reaction tube at the same time to produce $GaN_xAs_{1-x}$. By adjusting the supply amount of DMHy which is an N source, $GaN_xAs_{1-x}$ having nitrogen concentrations of 0.11%, 0.43%, 0.74%, 1.25%, 1.91% and 2.33% (hereinafter referred to as "samples of Comparative Example") were produced. The N concentration in $GaN_xAs_{1-x}$ was confirmed by means of X-ray diffraction (XRD) measurement.

2.2 Photoreflectance (PR) Spectrometry Measurement

Figure 10:
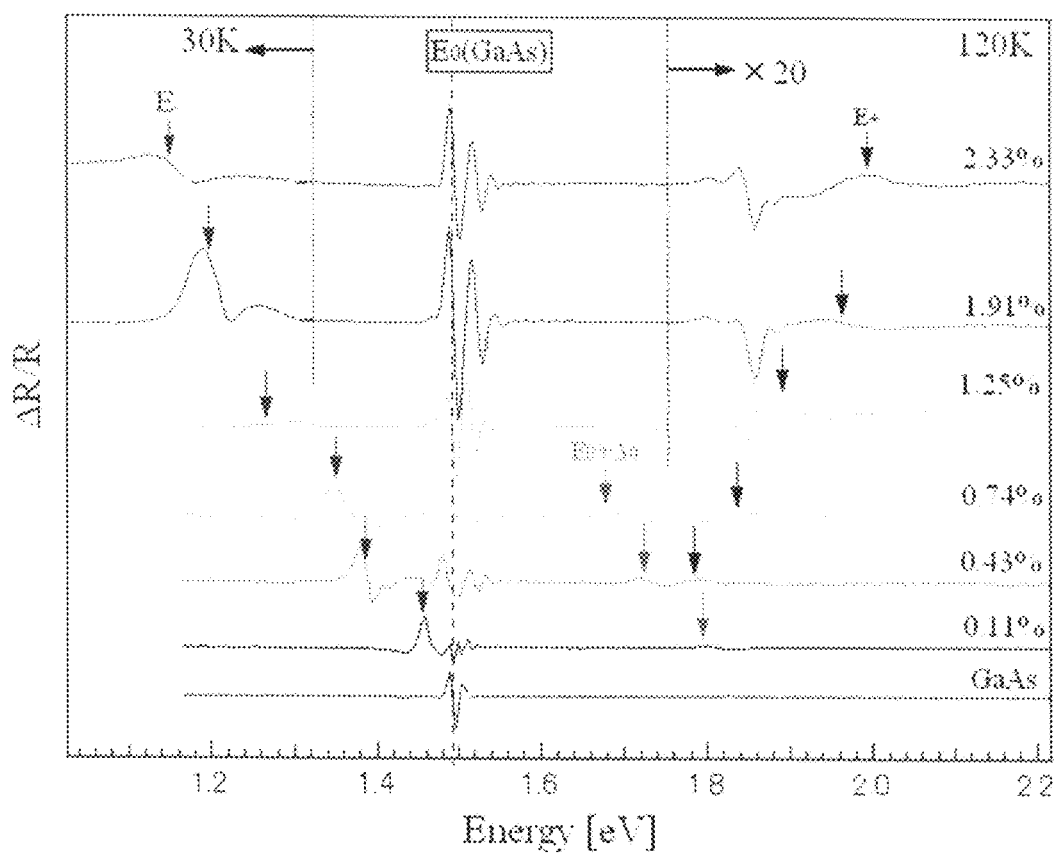
FIG. 10 is a view to show results of the photoreflectance spectroscopy of Comparative Example.

Regarding GaAs and the above samples of Comparative Example in which the nitrogen concentrations are adjusted in six levels, PR spectrometry measurement was carried out by means of the same measurement system as in the sample of Example. The measurement was carried out at 120K except that the samples having nitrogen concentration of 1.91% and 2.33% were measured at 30K in a region of 1.3 eV or less. The results are shown in FIG. 10. The reflectance change ΔR/R is taken along the vertical axis of FIG. 10, and the energy [eV] is taken along the horizontal axis. For the sake of easy confirmation of peaks, regarding the samples having nitrogen concentrations of 1.25%, 1.91% and 2.33%, the results in the region of 1.75 eV or more is shown enlarged twenty times to a vertical direction of the paper surface of FIG. 10.

As shown in FIG. 10, in all of the samples of Comparative Example in which the nitrogen concentrations are adjusted in six levels, transition from the $E_-$ band shifting to a lower side of energy along with the increase of nitrogen concentration was observed. Also, from the samples having nitrogen concentrations of 0.43% or more, transition from $E_+$ band shifting to a higher side of energy was observed. In addition, as shown in FIG. 10, transition $E_0$ between the bands of the GaAs substrate and transition $(E_0+\Delta_0)$ between the valence band that was split due to spin orbital interactive action of $GaN_xAs_{1-x}$ and the conduction band were also observed.

2.3. Fitting

Fitting was performed to the PR spectrum shown in FIG. 10 to obtain each transition energy from the obtained fitting parameter. The three-dimensional differential formula of Aspnes (the following Formula (1)) disclosed in "D. E. Aspnes, "Third-derivative modulation spectroscopy with low-field elsctroreflectance", Surface Science, 1978, Vol. 37, pp. 418-442" was used as a fitting carve.

[Formula 1]

$$\frac{\Delta R}{R} = \text{Re}[Ce^{i\theta}(E - E_g + i\Gamma)^{-n}] \quad (1)$$

Figure 11:
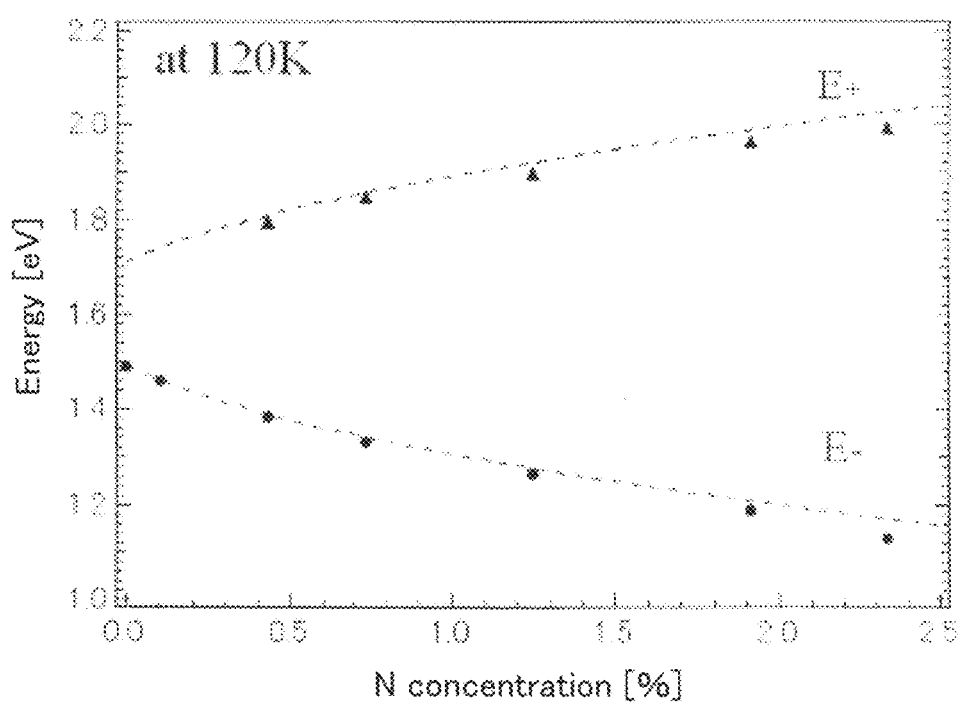
FIG. 11 is a view to compare a transition energy obtained from a PR spectrum and a transition energy obtained from a BAC model.

In the above Formula 1, C is a vibration constant, θ is a phase constant, Γ is a broadening constant and n corresponds to a dimensionality of band and n=2.5 in this configuration. FIG. 11 is a graph in which the transition energy from the $E_+$ band and the transition energy from $E_-$ band each obtained from the PR spectrum shown in FIG. 10 are plotted to the nitrogen concentration. The dashed line shown in FIG. 11 is the transition energy obtained from BAC (Band anti crossing) model. As shown in FIG. 11, the obtained transition energy from the $E_+$ band and the obtained transition energy from the $E_-$ band were well corresponded to the prediction by BAC model. Therefore, it is considered that $E_-$ band (intermediate band) is formed also in the forbidden band of GaAs in the samples of Comparative Example. However, as shown in FIG. 10, the PR signal equivalent to the transition from the $E_+$ band is flat compared with the PR signal equivalent to the transition from $E_-$ band and the intensity of the PR signal is very weak which is around one for every several or several scores of the PR signal equivalent to the transition of $E_-$ band. Therefore, it is considered that an unclear intermediate band was formed in the forbidden band in each of the samples of Comparative Example.

With conventional methods, only an unclear intermediate band is formed. However, from the above results, it was confirmed that a clear intermediate band can be formed according to the present invention.

DESCRIPTION OF THE REFERENCE NUMERALS 1 backside electrode
2 p-type substrate
3 light absorbing layer
3x first layer
3y second layer
4 n layer
5 comb-shaped electrode
10 photovoltaic device

The invention claimed is:

1. A photovoltaic device comprising:
a light absorbing layer, consisting of:
a plurality of first layers made of a first semiconducting material of GaAs; and
a plurality of second layers made of a second semiconducting material of $GaN_xAs_{1-x}$ wherein $0.003 \leq x \leq 0.4$,
wherein
the first layers and second layers are alternately arranged,
N atoms of the second layers adjacent to each other across an intermediate first layer in a thickness direction of the light absorbing layer are substantially equidistant from one another in the thickness direction,
each of the plurality of first layers comprises Si atoms in a range from $10^{17}$ to $10^{18}$ atoms per 1 $cm^3$, and
the second semiconducting material includes a localized level or an intermediate band in a forbidden band; at least two of the second layers are each disposed between a pair of the first layers; and a thickness of each of the second layers is thinner than a thickness of four molecular layers of the first semiconducting material.

2. The photovoltaic device according to claim 1, wherein, defining a thickness of each of the first layers as w1 and the thickness of each of the second layers as w2, w1+w2 satisfies 3.3 nm $\leq$ w1+w2 $\leq$ 20 nm.

3. The photovoltaic device according to claim 1, wherein, defining the thickness of each the first layers as w1 and the thickness of each of the second layers as w2, w2/(w1+w2) satisfies $0.05 \leq w2/(w1+w2) \leq 0.30$.

4. The photovoltaic device according to claim 1, wherein a concentration of an additive element having a different electronegativity from that of at least one element configuring the first semiconducting material to an entirety of the first layers and the second layers is 0.10 mole % or more and 2.0 mole % or less.

5. A method for manufacturing the photovoltaic device according to claim 1, the method comprising:
forming a Si doped, first layer on a base material, the first layer being made of a first semiconducting material of GaAs;
forming a second layer on a surface of the first layer, the second layer having a thickness thinner than a thickness of four molecular layers of the first semiconducting material and being made of a second semiconducting material of $GaN_xAs_{1-x}$ and $0.003 \leq x \leq 0.4$, by going through a process of supplying a part of elements configuring the first semiconducting material and an additive element of N, the additive element producing a localized level or an intermediate band in a forbidden band;
forming a first layer on a surface of the second layer, the first layer being made of the first semiconducting material;
forming a secondary second layer on a surface of the first layer formed on the surface of the second layer, the secondary second layer having a thickness thinner than the thickness of four molecular layers of the first semiconducting material and being made of the second semiconducting material, by going through a process of supplying a part of elements configuring the first semiconducting material and the additive element; and
forming a first layer on a surface of the secondary second layer, the first layer being made of the first semiconducting material.

6. The method for manufacturing the photovoltaic device according to claim 5, wherein, defining a thickness of the first layer as w1 and the thickness of the second layer as w2, the step of forming the first layer and the step of forming the second layer are controlled so that w1+w2 satisfies 3.3 nm $\leq$ w1+w2 $\leq$ 20 nm.

7. The method for manufacturing the photovoltaic device according to claim 5, wherein, defining the thickness of the first layer as w1 and the thickness of the second layer as w2, the step of forming the first layer and the step of forming the second layer are controlled so that w2/(w1+w2 satisfies $0.05 \leq w2/(w1+w2) \leq 0.30$.

8. The method for manufacturing the photovoltaic device according to claim 5, wherein the step of forming the first layer and the step of forming the second layer are controlled so that a concentration of the additive element to an entirety of the first layer and the second layer is 0.10 mole % or more and 2.0 mole % or less.

* * * * *